United States Patent [19]

Van House

[11] Patent Number: 5,159,195
[45] Date of Patent: Oct. 27, 1992

[54] POSITION MICROSCOPY

[75] Inventor: James C. Van House, Vashon Island, Wash.

[73] Assignee: The University of Michigan, Ann Arbor, Mich.

[21] Appl. No.: 784,239

[22] Filed: Oct. 29, 1991

Related U.S. Application Data

[63] Continuation-in-part of Ser. No. 618,521, Nov. 23, 1990, Pat. No. 5,063,293, which is a continuation of Ser. No. 359,951, Jun. 1, 1989, abandoned.

[51] Int. Cl.$^5$ .............................................. H01J 37/26
[52] U.S. Cl. ................................... 250/309; 250/306; 250/307; 250/308
[58] Field of Search ................. 250/309, 306, 307, 308

[56] References Cited

U.S. PATENT DOCUMENTS

| 4,740,694 | 4/1988 | Nishimura et al. | 250/306 |
| 4,864,131 | 9/1989 | Rich et al. | 250/308 |
| 5,063,293 | 11/1991 | Rich et al. | 250/308 |

Primary Examiner—Jack I. Berman
Attorney, Agent, or Firm—Rohm & Monsanto

[57] ABSTRACT

A positron microscope utilizes a time-of-flight adjustment and a beam gate to distinguish images produced by respective types of positronium events. If the time-of-flight of secondary electrons is approximately between 30 and 40 ns, then the electron image will represent prompt annihilations and parapositronium distributions in the target. For time-of-flight between 50 and 100 ns longer than the processing time of the electronic gating circuitry, the electron image will be a map of long-lived orthopositronium events.

13 Claims, 8 Drawing Sheets

POSITION MICROSCOPY

RELATIONSHIP TO OTHER APPLICATIONS

This application for United States Letters Patent is a continuation-in-part patent application of Ser. No. 07/618,521, filed Nov. 23, 1990, which will issue as U.S. Pat. No. 5,063,293 on Nov. 5, 1991, which is a continuation of Ser. No. 07/359,951, which was filed on Jun. 1, 1989, now abandoned.

BACKGROUND OF THE INVENTION

This invention relates generally to microscope systems of the type which employ subatomic particles in the imaging process, and more particularly, to transmission and re-emission positron (e+) microscope systems wherein low energy, or slow, positron beams are employed.

Notwithstanding that during the past ten years it has become possible as a result of advances in technology to produce low energy (on the order of 1 eV) positron beams from an initially high energy positron source, typically with an intensity on the order of $10^7$ e+/sec., it is generally believed by persons skilled in this art that the development of an effective positron microscope system is not feasible at the present due to the low intensity and current density of available positron beams. This is entirely contradistinct from the ease with which electron (e−) beams are generated having sufficiently high flux to permit production of images visible to the eye. Such e− beams, which are easily produced, illustratively from a heated tungsten filament, are of high quality and have magnitudes of current on the order of tens of microamperes ($10^{15}$ e−/sec.).

In addition to having low current densities, current slow positron beams are reduced in their output flux by a factor of at least $10^3$ during improvement of beam quality to meet the requirements necessary to produce a good image. This factor results from the following:

1. Between the source and the sample being investigated a set of electron focussing lenses are required so as to produce a highly parallel beam which is extremely small. Such focussing results in a diminution in beam intensity by a factor of 10.

2. After the beam interacts with the target, a further set of electron lenses selects a very narrow angular cone of the emitted beam so as to produce a high contrast, high resolution image. Such angular selection results in an additional factor of $10^2$ loss in rate.

3. Finally, the beam is magnified and projected onto a detector. As a result of the limits on the size of the detector, this magnification (M) process can result in further losses which increase as a function of $M^2$. It is therefore evident, that for the electron source, approximately $10^{12}$ e−/sec. can be utilized in image formation while in a positron environment, at best, only $10^4$ e+/sec. are available.

Under the best possible conditions, the human eye can detect an image produced by beam current densities as low as $10^8$ e−/cm²-sec. incident on a phosphor screen. With the use of currently available image intensifiers, plus computer-based signal averaging, it is possible to detect images at densities as low, or lower, than $10^6$ e−/cm²-sec. Under the lowest possible useful microscope magnification, the positron beam discussed above will have a current density of $10^5$ e+/cm²-sec. This is approximately one order of magnitude below what is normally used in high resolution, low dose, electron microscopy, and is one of the primary reasons why positron microscopy has not been considered to be feasible.

The significance of a positron microscope system in the art is made evident from an understanding of the manner in which positrons interact with matter. When positrons are injected into matter, a number of interactions occur between the injected particle and the medium into which it is injected. A positron may undergo one or more scatterings, it may be backscattered out of the medium, or it may cause ejection of a secondary electron. If the medium is sufficiently thin, and if the positron has sufficient energy, it may be transmitted right through the medium.

In the transmission mode of operation, no significant new physics is expected to occur at low magnifications in the operation of a transmission positron microscope. This is because the fundamental interactions responsible for removing positrons from a transmission positron microscope beam are essentially identical to those for removing electrons from a transmission electron microscope beam. On the other hand, diffraction patterns obtained from thin samples could be studied in a manner analogous to diffraction studies using transmission electron microscopes. Such diffraction patterns will be different from corresponding electron diffraction patterns, particularly at energies below 10 keV.

It should also be possible to exploit the fact that the positron beam of the present invention is spin polarized with polarizations as high as P=0.7 being possible, albeit at a factor of 5 decrease in beam intensity. This should make it possible to perform Polarized Low Energy Positron Diffraction (PLEPD) in the transmission mode. The ensemble of high energy positrons emitted from the nuclear beta decay of the radioactive isotopes most commonly used to produce slow positron beams are naturally spin polarized as a consequence of the weak interaction that created them. The spin polarization of the high energy positrons is retained during their slowing down in the slow positron moderator. As a consequence, the slow positrons emitted from the moderator are also spin polarized. Acceleration and focusing of the slow positrons allows the formation of a spin polarized beam. The degree of spin polarization of the slow positron beam can be controlled by placing absorbers of a low atomic number between the source of high energy positrons and the moderator. The absorber acts on the principle that the lower energy part of the radioactive source spectrum (initially some tens of keV), which, as a consequence of the weak interaction, has a lower degree of spin polarization, stops in the absorber, rather than the moderator. Only the higher spin polarized, initially high energy positron of the source spectrum passes through the absorber to the moderator, and therefore the resultant slow positrons produced by the moderator have a higher degree of spin polarization. The direction of spin polarization of the resultant positron beam can be controlled by the suitable application of crossed electrostatic and magnetic fields. Polarized positron microscopy, as a complement to the recently developed polarized electron microscope, should yield information on the exchange interaction and other spin-polarized phenomena.

Although the foregoing interactions occur for both, positrons and electrons, the fact that positrons are antimatter cause them to have certain characteristics which cause them to undergo types of interactions which are not shared by electrons. For example, a positron may combine with an electron, resulting in annihilation of the particles and emission of two gamma-rays in substantially opposite directions, each having an energy ($E=mc^2$) of approximately 511,000 eV. Alternatively, a positron may capture an electron to form the hydrogen-like positron-electron bound state called positronium (Ps). The Ps atom may annihilate in the medium into two or three gamma rays after a characteristic Ps lifetime, typically on the order of 1 to 3 nanoseconds, depending on the medium. Alternatively, the Ps may escape from the medium and live in a vacuum with a 140 nanosecond lifetime. In addition to the foregoing, the positron might stop in the medium and travel slowly (diffuse) to the surface where it can be ejected from the medium by electric fields which exist at most surfaces in a vacuum. This surface electric field, which is also known as the work function, typically pulls electrons back into the medium, but can operate to repel positrons out of the medium.

The phenomenon of expelling slow positrons from the medium is known as "slow positron emission," and forms the basis of production of slow positron beams. In certain regards, this phenomenon is similar to the process of electron field emission.

In addition to the foregoing, the positron injected into a medium may be trapped in a defect, which is the absence of a positively charged atom. The positron will live in the defect for a lifetime which is to an extent determined by the size, charge, and other properties of the defect, after which the positron is annihilated. Thus, a positron microscope system can be expected to produce images resulting from at least the four phenomena: annihilation, positronium formation, slow positron emission, and defect trapping, such images not being achievable with electron microscopy.

The foregoing notwithstanding, there do exist significant similarities between electrons and positrons, and in the manners in which microscopy employing these particles can be conducted. Referring for the moment to electron microscope systems, the electron microscope can take different forms, illustratively the transmission electron microscope (TEM) and the reflection electron microscope (REM). In both such types, a scanning process may be applied to achieve imaging of relatively large areas at high magnification.

The TEM operates by transmitting a high energy (20 keV to 1 MeV) electron beam having a small diameter on the order of $10^{-5}$ meter through a thin slice of the material to be studied. During transmission of the beam through the sample, different parts of the beam are strongly scattered out of the beam, or blocked. The degree of scattering is dependent on variations in the composition of the target. After transmission, the initially uniformly distributed beam is characterized by regions of low intensity where the sample has preferentially eliminated electrons from the beam, and regions of high intensity where the sample and beam had little interaction. Thus, an image of the sample is contained in the information in the intensity distribution in the beam. The relative difference in intensity between the regions of high and low intensity is called the contrast of the image. At this point, just after transmission through the sample, the beam and its image information are still contained in the original $10^{-5}$ meter beam diameter, and the image size is identical to the size of the different features in the sample which produced the regions of high and low intensity. This narrow beam propagates to the vicinity of a series of powerful electron lenses, which are usually magnetic fields, and which are applied to increase the beam diameter from $10^{-5}$ meters up to several meters in diameter without distortion of the image information contained in the beam. This can result in a magnification factor of up to $10^6$. A large fraction of the outer edge of the beam is therefore lost in the magnification process. The magnified high energy electron beam is then allowed to strike a phosphor screen where the electron kinetic energy is converted into light, producing an optical image, with regions of high intensity corresponding to the absence of a given feature. At this point, a feature of 1 Å diameter ($10^{-8}$ cm) in the sample will appear on the phosphor screen as a dark area of 0.1 mm in diameter, a size which can be seen by the human eye.

The ability to distinguish small features on the image is called the "resolution" of the electron microscope. For the 1 Å feature discussed above, the resolving power of the microscope is 1 Å. In principle, features of any size can be resolved from each other with high enough magnification and beam current density. In practice, however, quantum mechanical effects limit the resolving power of the electron microscope to distinguishing features of about 1 Å from each other.

Another phenomenon which appears in the TEM is diffraction. This effect is primarily quantum mechanical in nature and arises from the wave nature of the particles involved. In certain regards, the diffraction effect is qualitatively similar to the wave patterns produced when two waves intersect on a pond. The wave pattern of the incident electron will interact with the different wave patterns of electrons in the sample in a way which produces highly regular patterns of high transmission and low transmission. Each different type of molecule has its own unique diffraction pattern which identifies it like a fingerprint. Thus, the diffraction patterns can be used to identify the composition of a given sample. The diffraction patterns are also sensitive to changes in the chemical binding of one molecule to another, to the orientation of any crystal planes which may be in the sample, and to some types of defects in the sample.

The Reflection Electron Microscope (REM) has magnifying optics as does the TEM, but these optics magnify images resulting from electrons which scatter backwards from the initial beam direction. These electrons are produced primarily from two processes, and include: (1) elastically backscattered electrons which retain their high energy, and (2) secondary electrons which are emitted with about 30 volts of energy. As a result of their low energy, detection techniques which are different from those used in TEM are frequently used to form an image from the secondary electrons.

The images formed from the two types of electrons emitted will highlight different features of the sample, because the basic interactions involved in their production are different. Backscattered electrons are produced primarily from the nuclei of the atoms, whereas secondary electrons are produced by interactions with the electrons in the medium. Thus, complementary features can be compared directly.

The basic advantage of the reflection mode of electron microscopy is that it obviates the need to make thin slices of the sample to form an image. A wider range of targets, including targets which would be destroyed by slicing, can be studied using the REM. Such targets include, for example, integrated circuit chips.

The formation of images from secondary electrons becomes particularly powerful when combined with a scanning technique. No essential difference should exist between the deflection plate design of a scanning electron microscope, and that of a scanning positron microscope. In both cases, the deflection plates would consist of two independent parallel pairs rotated at 90° with respect to one another. One pair controls the x position of the beam, and the other pair controls the y position of the beam. The x, y position of the beam is controlled by application of varying electric fields to the pairs of the plates. The plates are located as the last element in the electron optical system prior to the beam hitting the target.

In this mode of operation an extremely small beam, having a size typically on the order of $10^{-8}$ meters in diameter, is swept along the surface of the target by means of electric deflection plates. The secondary electron current is detected as the beam sweeps the target and an image is formed from the variation in current as a function of position. Using the scanning technique allows the use of low energy electron beams (less than 1000 volts), which reduces the amount of damage to the sample, and also reduces the time required to examine each specimen.

It is, therefore, an object of this invention to provide a positron microscope system.

It is another object of this invention to provide a positron microscope system which utilizes slow positron beams.

It is also an object of this invention to provide a positron microscope system which is simple and inexpensive.

It is a further object of this invention to provide a positron microscope system which can produce images of selected types of positron-electron interactions.

It is additionally an object of this invention to provide a positron microscope system wherein imaging can be achieved in a backscattering, or reflection, mode of operation.

It is yet a further object of this invention to provide a positron microscope system wherein imaging can be achieved in a transmission mode of operation.

It is yet an additional object of this invention to provide a modified electron optical lens system for use with a moderated positron beam.

It is still another object of this invention to provide a positron microscope system wherein imaging can be achieved using low beam current densities.

It is also a further object of this invention to provide a positron microscope system which utilizes the phenomenon of slow positron re-emission to produce an image.

It is additionally another object of this invention to provide a positron microscope system which utilizes the phenomenon of positron annihilation to produce an image.

A further object of this invention is to provide a positron microscope system which utilizes the phenomenon of positronium formation to produce an image.

An additional object of this invention is to provide a positron microscope system which utilizes the phenomenon of defect trapping to produce an image.

Another object of this invention is to provide a positron microscope system which can produce a spatial image.

A yet further object of this invention is to provide a system which can be used to study electron momentum and distribution of electron momenta.

It is also an additional object of this invention to provide a system which can be used to generate a spatial image corresponding to the distribution of electron momenta.

A still further object of the invention is to provide a positron microscope system which utilizes positronium atoms to generate an image.

An additional object of the invention is to provide a positron microscope system which utilizes gamma rays resulting from positron annihilation to generate an image.

Yet another object of the invention is to provide a system which utilizes spin polarized positrons to facilitate diffraction studies.

Also, it is an object of this invention to provide a positron microscope system which can generate correlated images using transmission and reflection modes of operation simultaneously.

Still another object of this invention is to use spin polarized positrons to generate images.

SUMMARY OF THE INVENTION

The foregoing and other objects are achieved by this invention which provides a positron microscope system which produces magnified images of a specimen target. In accordance with the invention, a slow positron source produces a source beam formed of low energy positrons. The source beam is focused and directed to the specimen target to produce secondary electrons. A time-of-flight adjustment arrangement controls the duration of the period of travel of the secondary electrons, and a gate, having closed and opened states, controls passage therethrough of the secondary electrons.

In a preferred embodiment of the invention, a detector is provided for detecting incident ones of the secondary electrons, the detector being arranged on the otherside of the gate from the time-of-flight adjustment arrangement. There is additionally provided one or more gamma-ray detectors for detecting gamma-rays produced by annihilations of positrons and electrons. The gamma-ray detector is arranged in the vicinity of the target specimen. In one highly advantageous embodiment, the open and closed states of the gate are responsive to the gamma-ray detector.

The arrangement for adjusting the time-of-flight of the secondary electrons can be achieved by adjusting the length of the path of travel of the secondary electrons. In other embodiments, acceleration or decelerating voltages can be applied to structure in the vicinity of the path of travel to achieve the same effect.

In accordance with a further aspect of the invention, a positron microscope system produces magnified images of a specimen target, and is provided with an arrangement for directing positrons to the specimen target for producing secondary electrons which are emitted from the specimen target in response to incident ones of the positrons. A gamma-ray detector produces an electrical detector signal in response to gamma-rays which are produced upon interaction between positrons and electrons. Additionally, a gate is provided for controlling passage therethrough of the secondary electrons.

In a preferred embodiment, the gate assumes open and closed states in response to the detector signal issued by the gamma-ray detector. Additionally, as previously described, an arrangement is provided for controlling the time-of-flight of the secondary electrons.

In accordance with a method aspect of the invention, the method comprises the steps of:

producing a slow positron beam;

propagating said slow positron beam to a specimen target to produce secondary electrons at the target;

gamma-ray monitoring at least one gamma-ray produced in response to communication between said slow positron beam and said specimen target; and controlling the open and closed states of a gate in the path of said secondary electrons in response to said step of gamma ray monitoring.

In other embodiment of the method aspect of the invention, the time-of-flight of the secondary electrons between the specimen target and the gate is controlled. Additionally, images responsive to selected types of positron events can be generated by controlling the time-of-flight of the secondary electrons.

BRIEF DESCRIPTION OF THE DRAWING

Comprehension of the invention is facilitated by reading the following detailed description in conjunction with the annexed drawing, in which.

DETAILED DESCRIPTION

Figure 1:
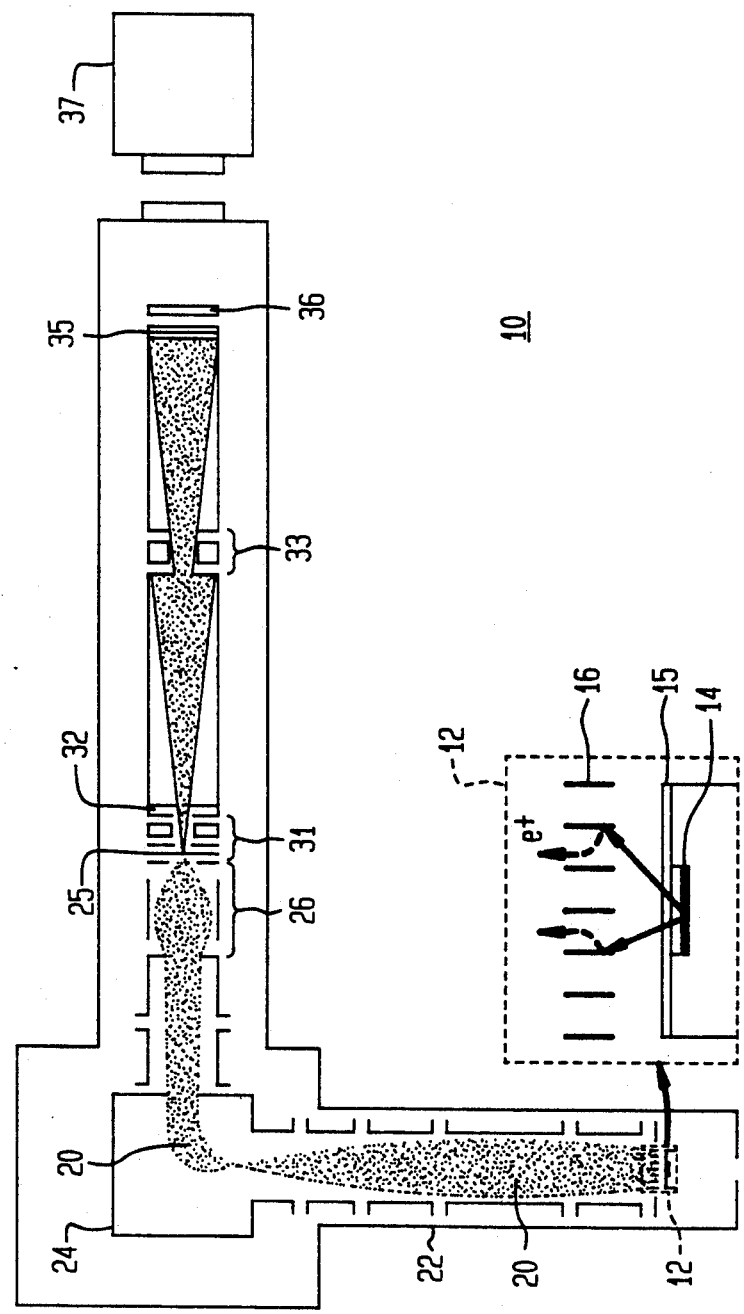
FIG. 1 is a schematic representation of a transmission positron microscope system, constructed in accordance with the principles of the invention.

FIG. 1 is a schematic representation of a transmission positron microscope system 10 constructed in accordance with the principles of the invention. Positrons are obtained from a moderator system 12 which is illustrated in detail in the figure. More specifically, moderator system 12 is provided with a positron source 14 formed of $^{22}Na$. In this specific illustrative embodiment, the $^{22}Na$ source is 5 mm in diameter with a radioactivity of 40 mCi. The positrons which are emitted by positron source 14 have an energy illustratively between 100 and 500 keV. Positron source 14 is installed on a titanium (Ti) window 15 which prevents the passage of air therethrough, but permits passage of positrons into the positron microscope system. The positrons which enter the positron microscope system are incident upon a set of Tungsten (W) vanes 16 which are annealed at 2500° C. After losses resulting from source self-absorption, approximately $4 \times 10^{-4}$ of the source positrons are re-emitted at about 2 volts.

The incidence of high energy positrons from positron source 14 onto tungsten vanes 16 causes the positrons to thermalize in tungsten vanes 16, resulting in the slow positrons being emitted. Such slow positrons are emitted with probability of approximately $10^{-3}$ into the positron microscope system.

The slow positrons emitted from tungsten vanes 16 form a positron source beam 20 which is propagated within transmission positron microscope system 10. Positron source beam 20, in this embodiment, has a rate which consists of approximately $7 \times 10^5$ positrons/sec, and is propagated along a beam path 22 to a bending magnet 24. As can be seen from the drawing, the bending magnet, in this embodiment, redirects positron source beam 20 to propagate in a direction substantially orthogonal to beam path 22, and toward a target 25. However, prior to reaching target 25, positron source beam 20, after being bent, is subjected to a condenser lens 26 which focuses the positron source beam onto the target.

In this specific application of transmission positron microscope system 10, target 25 is a polyvinyl chloride acetate co-polymer (V.Y.N.S.) foil. This foil has a thickness which is less than 800 Å, the foil being selected for this purpose in view of the ease with which it can be fabricated in films thin enough for the present application.

In this transmission embodiment of the invention, ones of the positrons which are transmitted through target 25 form a target beam 30 which contains the imaging information. The target beam is propagated through an objective lens 31, a contrast aperture 32, and projector lens 33, and imaged on a Channel Electron Multiplier Array (CEMA) 35 having three plates and a phosphor 36, which in this embodiment, has a long persistence P39 phosphor.

The combination of Channel Electron Multiplier Array 35 and phosphor 36 converts each of the positrons into a spot of light having approximately $2 \times 10^{-2}$ cm in diameter. This spot of light (not shown) is detected by an image analysis system 37, which is formed of a combination of a video camera, preferably of the low light type, and an image processor. In operation, image analysis system 37 stores data corresponding to the event in an appropriate location of a memory (not specifically shown), which in one embodiment may be in the form of a $384 \times 384$ array. The image processing which occurs in image analysis system 37 results in a signal averaging which allows an image to be built up from the signal events registered by Channel Electron Multiplier Array 35. This may occur at rates as low as 200 Hz, which is a factor of $10^4$ lower than the lowest intensities typically used in electron microscopy.

Figure 2:
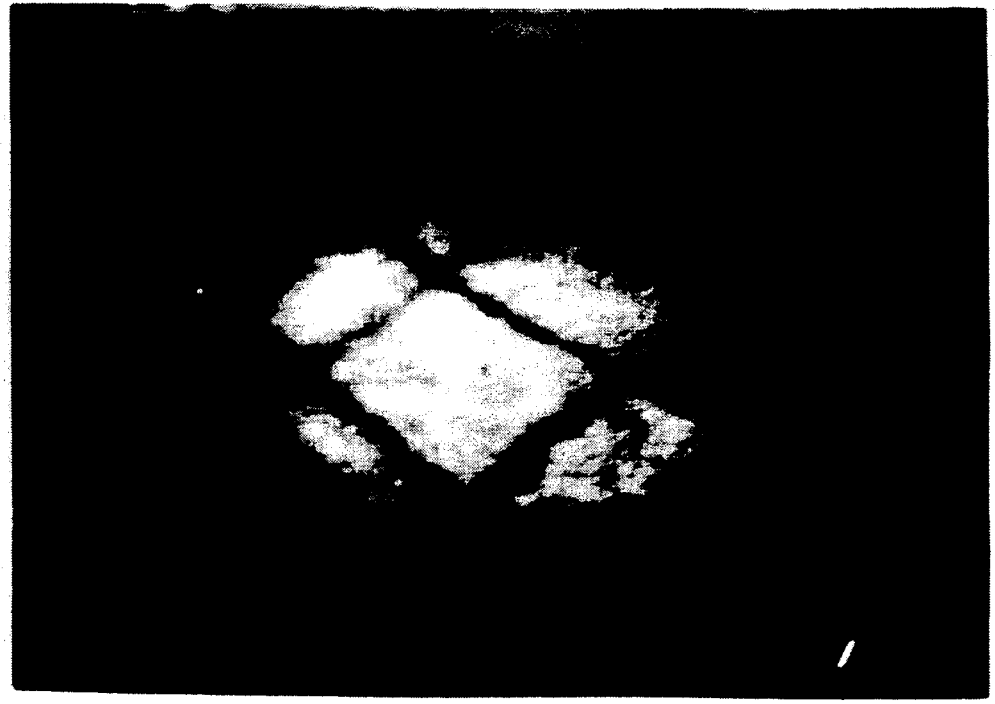
FIG. 2 is an image acquired using the positron microscope system of FIG. 1.

FIG. 2 is a representation of an image acquired using transmission positron microscope system 10, described hereinabove. As previously indicated, target 25 is a V.Y.N.S. film, having a thickness which is estimated not to be less than 800 Å, as determined using optical interferometry techniques. Target 25 was supported during the imaging process on a 100 line, 82% transmitting wire mesh. At these thicknesses, 20–50% of the incident beam was transmitted. The image shown in this figure represents magnification of $55\times$, and required 4 hours of signal averaging to accumulate. Magnification was calibrated from the known 250 μm grid wire spacing.

Figure 3:
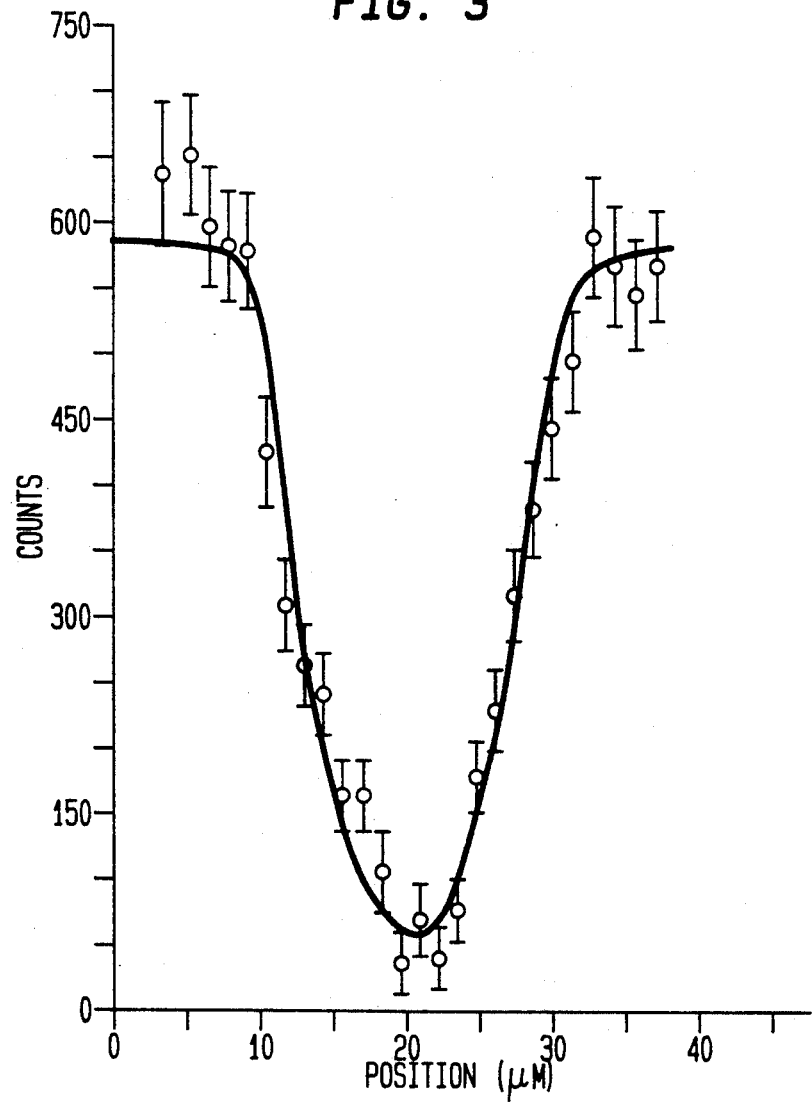
FIG. 3 is a histogram of an image of a grid wire of FIG. 2, using a least squares fit of a Gaussian function.

FIG. 3 is a histogram of one of the grid wires imaged in FIG. 2, corresponding to a least squares fit of a Gaussian function to the data shown in this figure, which was accumulated during imaging. The zero number of the counts was adjusted to display the entire grid wire profile, and the edges of the wire were fit to a Gaussian function, thereby giving a measured resolution in agreement with the theory.

Figure 4:
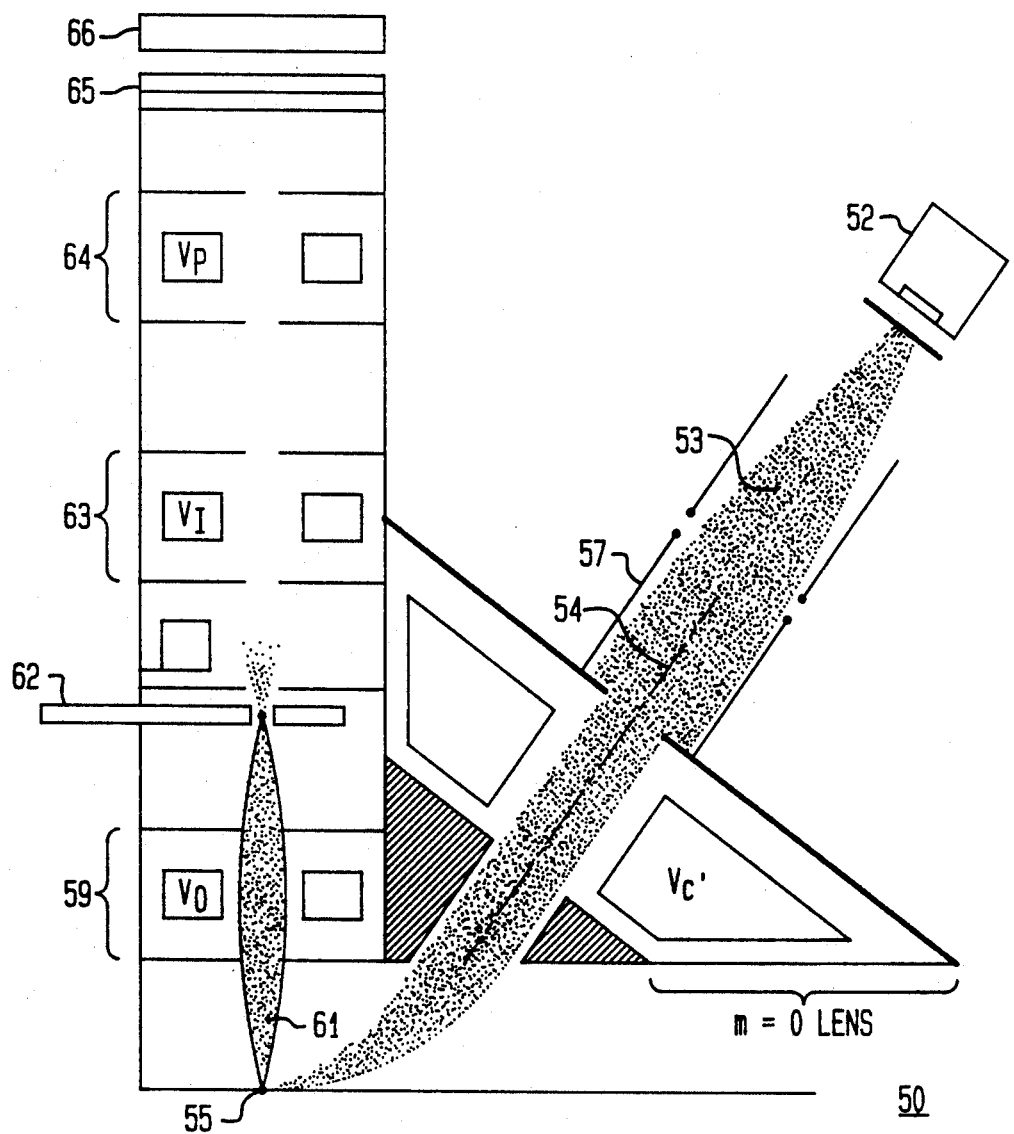
FIG. 4 is a schematic representation of a reflection-style positron re-emission microscope system which employs the principles of the invention.

FIG. 4 is a schematic representation of a reflection-style positron re-emission microscope system 50 constructed in accordance with the principles of the invention. As shown in the drawing, re-emission positron microscope system 50 is provided with a positron moderator 52 which, in this embodiment, provides a slow positron source beam 53 in a manner similar to moderator system 12 described hereinabove with respect to FIG. 1. Slow positron source beam 53 is a substantially parallel incident beam which propagates along a source beam axis 54 generally toward a target 55. The source beam axis, however, is straight only during propagation of slow positron source beam 53 within a beam path 57. Once slow positron source beam 53 approaches the vicinity of target 55, the axis of propagation bends in response to an accelerating electric field which is present between target 55 and an objective lens 59.

Figure 5:
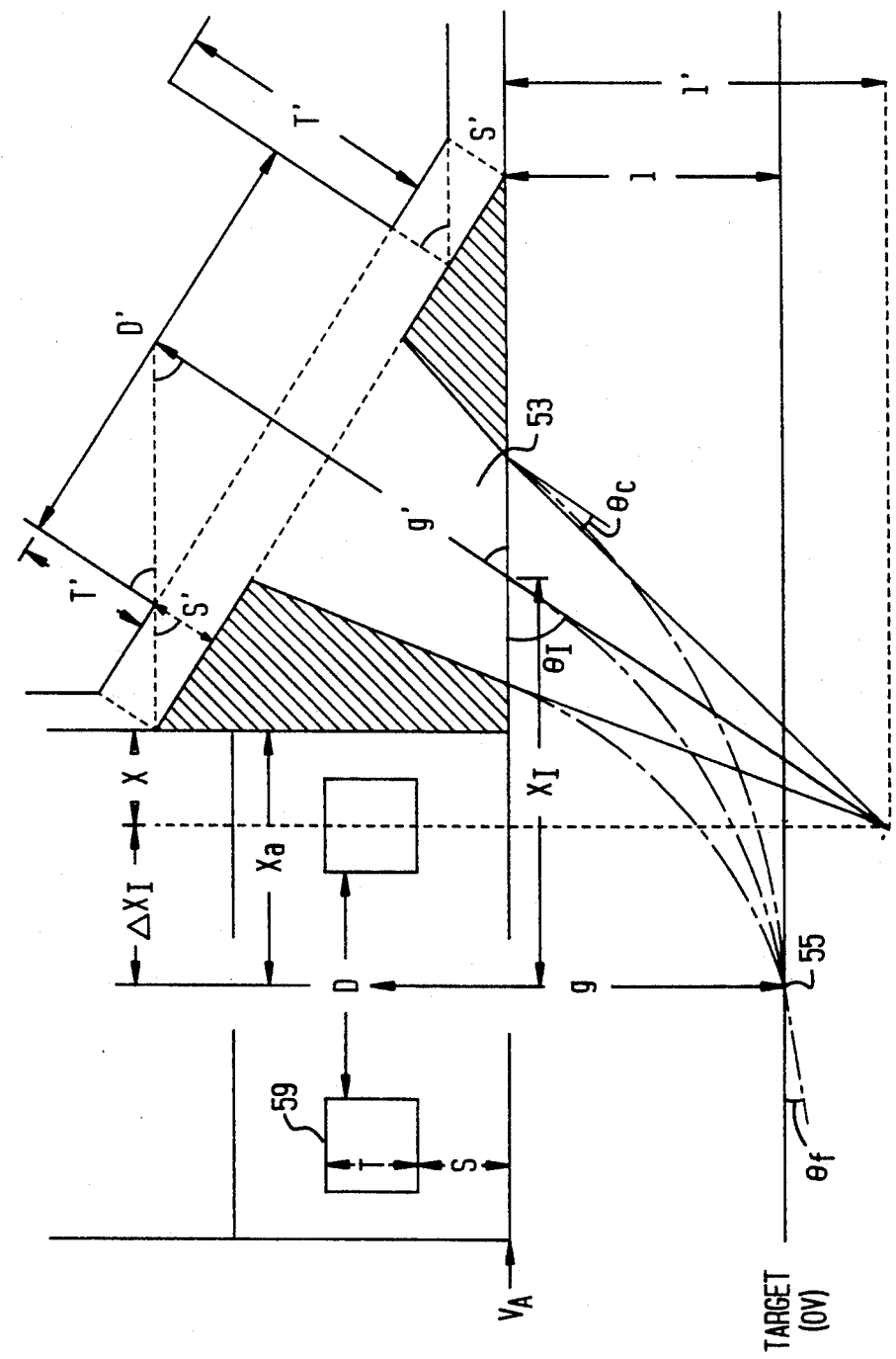
FIG. 5 is a schematic representation of the reflection-style positron re-emission microscope, illustrating the bending of the slow positron source beam as it passes through the electric field between target and the objective lens.

FIG. 5 is a schematic representation illustrating the bending of slow positron source beam 53 as it approaches the electric field between target 55 and objective lens 59. The result is to produce an effective reduction in the focal length from l' to l of an m=0 lens 60. In addition, the angle of incidence of the slow positron source beam with the target is shown in this figure to be changed from $\theta_i$ to $\theta_f$. Thus, the electric field has a significant effect on the focal position, and appears to cause the particles in slow positron source beam 53 to follow a parabolic path as they approach the target.

Referring once again to FIG. 4, a positron target beam 61, which is formed of positrons which thermalize in the target and are re-emitted from target 55 as a result of the incidence thereon of slow positron source beam 53, is accelerated by the electric field and then propagated past objective lens 59, a contrast aperture 62, an intermediate lens 63, and a projector lens 64 to a channel electron multiplier array 65 which produces an indication on a phosphor screen 66. Of course, a video and processing system, which could be similar to image analysis system 37 described with respect to FIG. 1, could also be employed to acquire and analyze an image.

Figure 6:
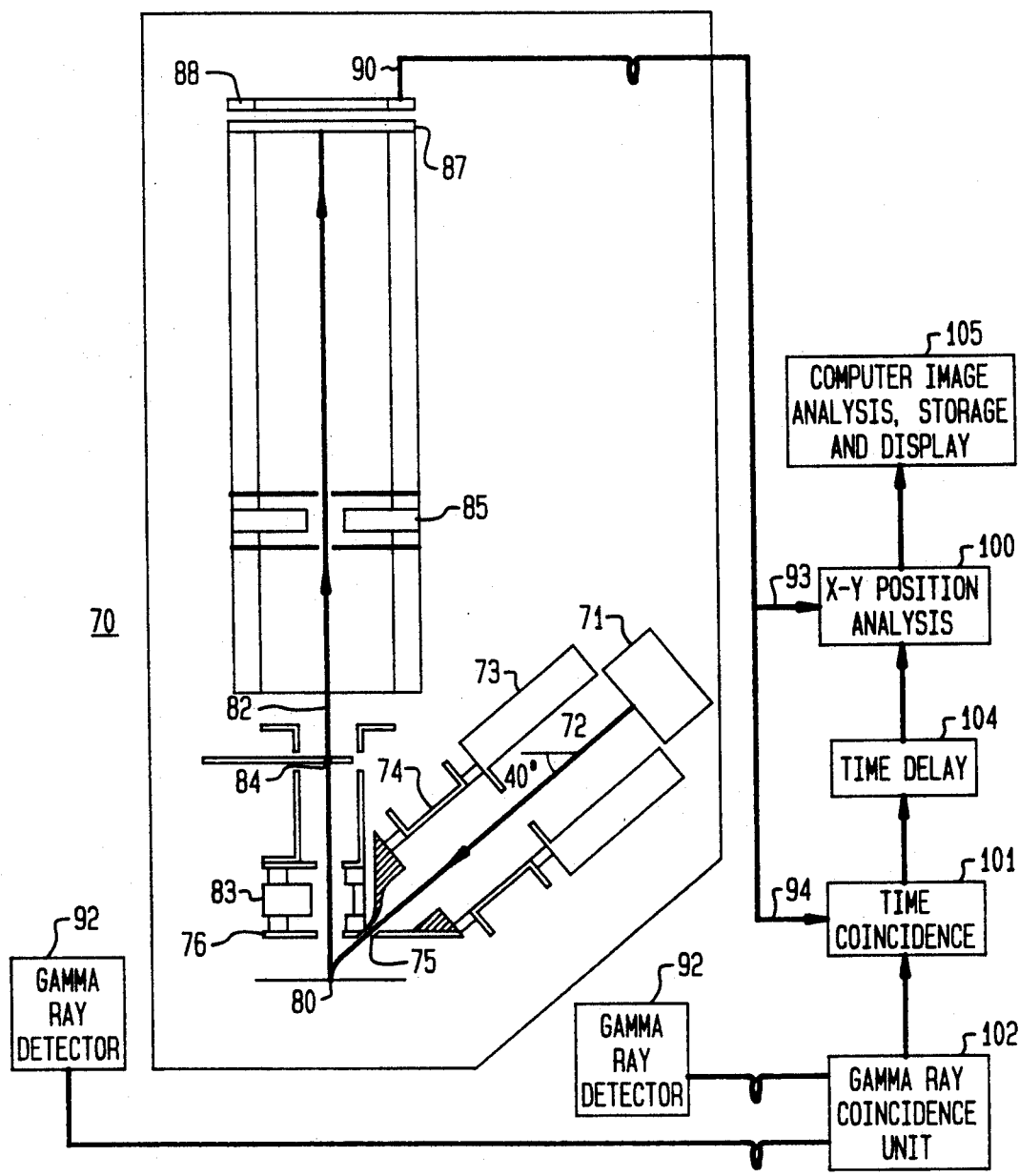
FIG. 6 is a schematic representation of a positron gamma ray microscope useful in the production of spatial images of dual gamma ray coincidences (prompt annihilations), triple gamma ray coincidences (Positronium formation), and momentum distribution (dual gamma ray coincidences with further angular analysis)

FIG. 6 is a schematic representation of a positron gamma ray microscope 70 useful in the production of spatial images of dual gamma ray coincidences (prompt annihilations), triple gamma ray coincidences (Positronium formation), and momentum distribution (dual gamma ray coincidences with further angular analysis). As shown, positron gamma ray microscope 70 is provided with a slow positron generation, focusing, and transport system 71 which produces a substantially parallel beam 72. This beam is propagated through an input lens 73 and is focused by a condenser lens 74 so as to be passed through a deflection block aperture 75 into an acceleration and deflection block 76. While beam 72 is within acceleration and deflection block 76, it is deflected, illustratively by an electric field, so as to follow a concave, downward parabolic path to a target 80. The geometry of acceleration and deflection block 76, and the electric field between this block and target 80, is such that the beam is substantially in focus when it arrives at target 80.

The secondary electrons which are emitted by the positron beam as it impacts target 80 are accelerated as a secondary electron beam 82 by acceleration and deflection block 76. The secondary electron beam 82 is propagated to, and focused by, an objective lens 83. The focused electrons of secondary electron beam 82 pass through a contrast aperture 84 which serves to limit the angular spread of secondary electron beam 82, thereby improving the resolution. The secondary electron beam continues its propagation until a magnified image is formed just prior to a projector lens 85. The projector lens focuses and further magnifies the image until a final magnified image is formed at a channel electron multiplier array (CEMA) 87. The channel electron multiplier array generates a multiplicity of electrons for each incident electron, localized in a small spot, which are then incident upon a resistive anode encoder (RAE) 88.

The resistive anode encoder is one of several devices which can generate signals suitable for simultaneous position analysis and timing information. These signals, which may be in the form of x,y readout signals, are conducted within the vacuum of positron gamma ray microscope 70 via a signal conductor 90. Once removed from the positron gamma ray microscope, the x,y readout signals are split into signals suitable for position analysis and timing information, as will be described hereinbelow.

Referring for the moment to positrons which impact target 80, these annihilate into gamma rays which are detected by gamma ray detectors 92. These gamma ray detectors may number either two, as shown in the Figure, for detecting annihilation, or three, for detecting formation of positronium. In embodiments wherein there are three such gamma ray detectors provided, they are arranged to be substantially coplanar with respect to one another. As will be described hereinbelow with respect to FIG. 7, each such gamma ray detector may be an array of gamma ray detectors, particularly if momentum analysis is desired to be performed.

In FIG. 6, the x,y readout signals are split into position signals 93, suitable for position analysis and timing signals 94 which provide timing information. Position signals 93 are conducted to an x,y position analysis system 100, and timing signals 94 are conducted to a time coincidence unit 101. The signals generated by gamma ray detectors 92 are conducted to a gamma ray coincidence unit 102 where spatial coincidence and energy requirements are determined using commercially available electronics. In this embodiment, the output of gamma ray coincidence unit 102 is conducted to an input of time coincidence unit 101, where a time coincidence with timing signals 94 from resistive anode encoder 88 is determined to exist. In the event of a coincidence, a signal from time coincidence unit 101 is delivered to a time delay 104, to adjust the position in time relative to the processing speed of x,y position analysis system 100, which has been analyzing position signals 93 in a manner substantially coincident in time with gamma ray coincidence unit 102. The signal from time delay 104 is delivered to the time gate (not shown) of x,y position analysis system 100, so as to release the event to a computer image processing memory and display 105 where it is stored.

Figure 7:
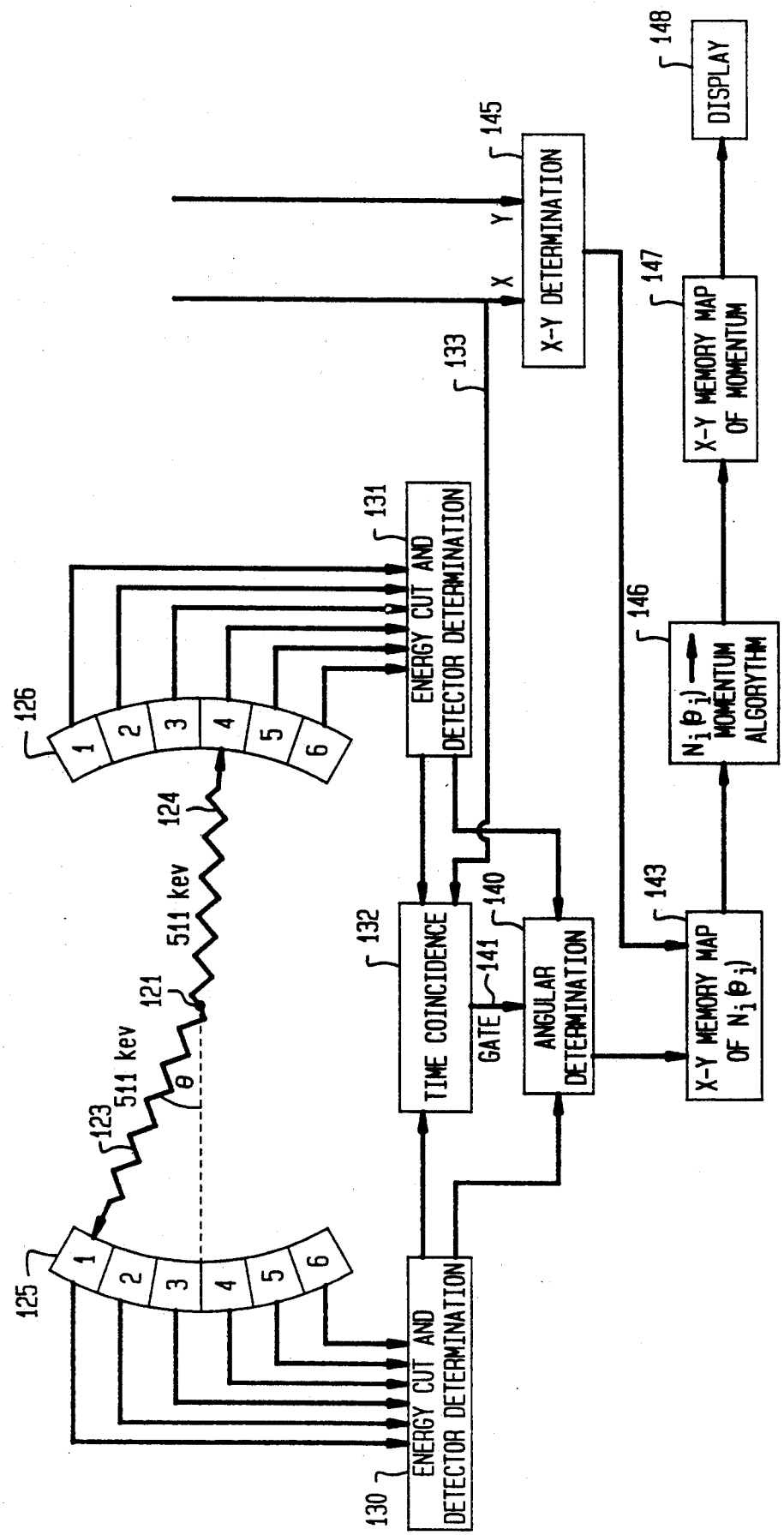
FIG. 7 is a function block and line representation of the momentum distribution analysis electronics.

FIG. 7 is a function block and line representation of a specific illustrative embodiment of a momentum distribution analysis electronic system 120. As shown, momentum distribution analysis electronic system 120 operates when a positron 121 annihilates with an electron to yield gamma ray 123 and gamma ray 124, as a pair of simultaneously issued gamma rays. Each gamma ray has an energy of approximately 511 keV, but shifted by a small angle $\theta$ from 180° by the electron momentum. The gamma rays are incident upon respectively associated ones of a pair, in this embodiment, of arrays of gamma ray detectors 125 and 126. Thus, gamma ray detector array 125 reacts to gamma ray 123 separately from gamma ray detector array 126 which reacts to gamma ray 124. As shown, each gamma ray detector array is formed of a plurality of individual detectors having a predetermined positional relationship with respect to one another. In this specific embodiment, each gamma ray detector array is shown to have six individual detectors therein.

Gamma ray detector arrays 125 and 126 are each coupled to deliver their signals to detector systems 130 and 131, respectively. These detector systems determine which one of the individual detectors within the detector arrays detected the gamma rays, and also the energy of the gamma rays.

If the energy is satisfactory, timing signals from detector system 130 and detector system 131 are conducted to a time coincidence unit 132, where a timing signal from a resistive anode encoder (not shown in this figure) is waiting via a timing signal line 133. In the meantime, signals from detector system 130 and detector system 131 corresponding to the numbers of the detectors within the arrays which detected the gamma rays are conducted to an angular determination unit 140 which utilizes the predetermined relative detector positions to determine the angular deviation.

If a triple time coincidence occurs, time coincidence unit 132 sends a signal to a gate input 141, and the angular determination from angular determination unit 140 is released to an x,y memory map unit 143. An x,y position for the angular determination is calculated from the x,y signals from the resistive anode encoder by an x,y determination unit 145 which conducts the x,y position signals to x,y memory map unit 143, essentially at the same time that it receives the angular determination. When sufficient data has been accumulated, a momentum algorithm 146 determines the electron momentum from the angular information in x,y memory map unit 143, and stores the resulting values in an x,y momentum memory map 147, which causes a responsive display to be produced on a video monitor 148.

The invention herein includes within its scope a further apparatus and method for forming images of those secondary electrons which are emitted by the target and which are time-correlated with an annihilation gamma-ray which is emitted by the recombination of one of the incident positrons with a target electron. This system is capable of producing images which contain the same information as those produced by the embodiment of the invention shown in FIG. 6. However, the structure associated with this second approach, which is described hereinbelow with respect to FIG. 8, is significantly simpler, since it does not require the channel electron multiplier array, nor the resistive anode encoder, to establish the time correlation necessary to distinguish those secondary electrons which contain gamma-ray information from those secondary electrons which contain no information about the gamma-rays.

Figure 8:
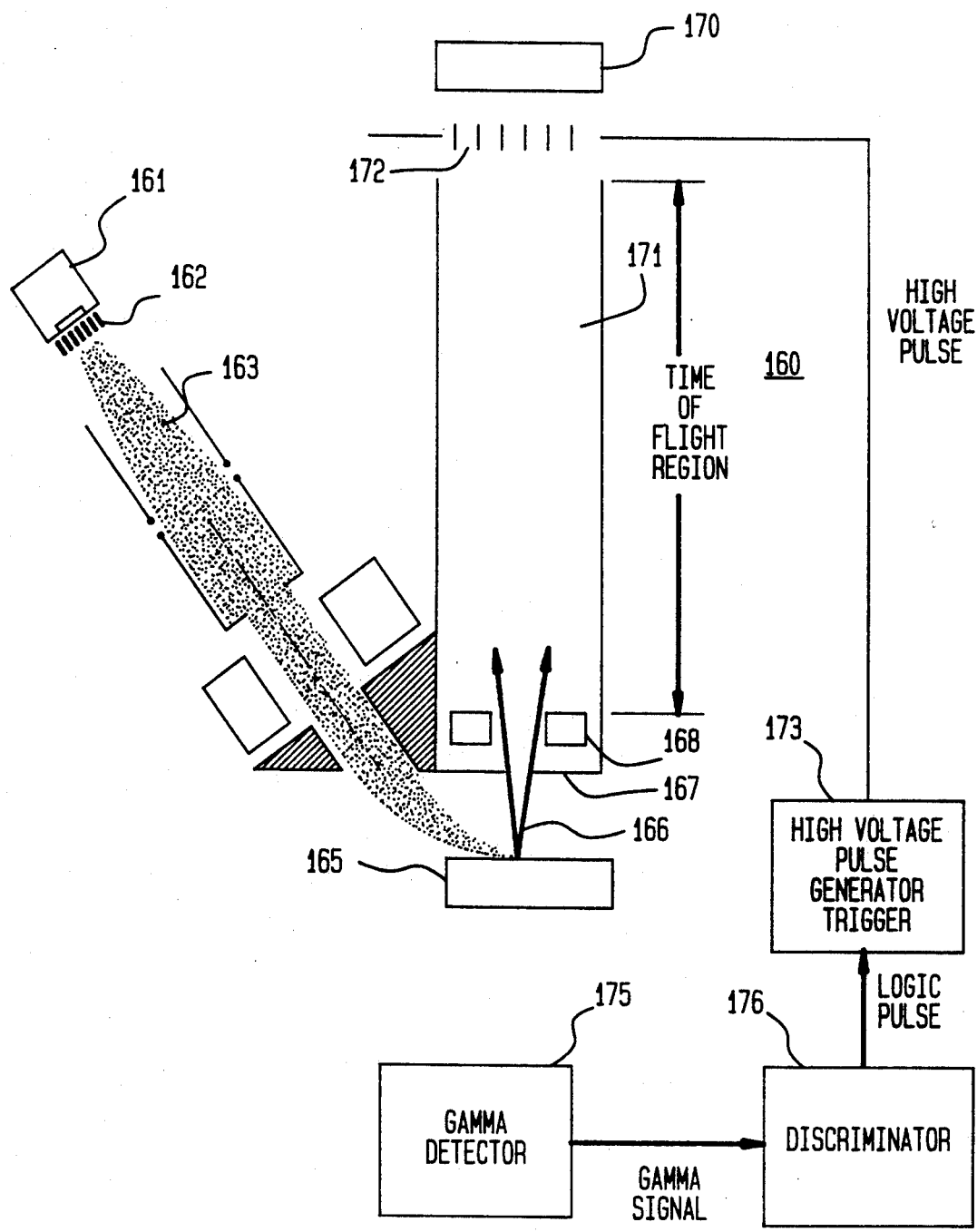
FIG. 8 is a schematic representation of a positron gamma ray microscope useful in the production of spatial images by a simplified structure which does not require a channel electron multiplier array or a resistive anode encoder.

FIG. 8 is a schematic representation of a positron gamma-ray microscope 160 which is useful in the production spatial images of secondary electrons emitted by a target. As shown, positron gamma-ray microscope 160 is provided with a radioactive source 161 and a moderator 162 to produce a slow positron beam 163. The low energy positron beam is produced by moderating, using a substance such as annealed tungsten. Thus, the high energy positrons produced by the radioactive source, such as $^{22}Na$, are thermalized to reduce their energy.

The beam is propagated and focused, substantially as described hereinabove with respect to FIG. 6, and is directed to a target 165. The slow positron beam may, in certain embodiments, be focused, as described hereinabove, when it arrives at target 165.

A secondary electron beam 166 is produced in response to the impact of slow positron beam 163 on target 165. This beam of secondary electrons is accelerated by anode 167 and focused by an objective lens 168.

Between the objective lens and a detector 170 is a region 171 which controls the time of flight of the secondary electrons by means of adjustability of the overall length of the region or by controlling a voltage. At the top end of time-of-flight region 171 is provided a normally-closed electrostatic beam gate 172 which does not permit passage of the electrons to detector 170 unless an appropriate signal is received from a high voltage pulse generator 173. The output signal of the high voltage pulse generator is responsive to a gamma-ray detector 175 which conducts a signal to the high voltage pulse generator via a discriminator 176. The high voltage pulse issued from high voltage pulse generator 173 which allows extraction of time-correlated information from the secondary electron image.

After passage of the time-correlated secondary electrons in secondary electron beam 166 through electrostatic beam gate 172, the time-correlated electrons are then incident upon detector 170. In one embodiment of the invention, the detector can be a phosphor screen if the electron rates are sufficiently high, or a channel electron multiplier array, if the electron rates are low.

As indicated, the gating signal is responsive to gamma detector 175. In the practice of the invention, however, more than one such gamma-ray detector can be placed near the target to detect the annihilation gamma-rays emitted when the positron annihilates with an electron in the target. After detection, the signal from the gamma detector is sent to discriminator 176 which generates a logic pulse. This logic pulse, in turn, is conducted to a trigger input of high voltage pulse generator 173.

Electron static beam gate 172 can be a simple grid, or a pair of deflection plates. When the pulse arrives, the gate is opened, allowing passage of an electron. Otherwise, the gate is closed, prohibiting such passage. Whether or not the secondary electrons pass through the electrostatic beam gate depends upon the time-of-flight of the electron from target 165 to the gate. This flight time is selected by the operator by changing the voltage or length of the time-of-flight region. First, the flight time must, at a minimum, be equal to the processing time of the electronics used to generate the high voltage gating pulse. If this criteria is met, and if the high voltage pulse is narrow, i.e., the time width is 30–40 ns or less, then the electron image will be a map of prompt annihilations and parapositronium distributions in the target. If the time-of-flight is 50-100 ns longer than the electronic processing time, then the electron image will be map of long-lived orthopositronium events.

Although the invention has been described in terms of specific embodiments and applications, persons skilled in the art can, in light of this teaching, generate additional embodiments without exceeding the scope or departing from the spirit of the claimed invention. Accordingly, it is to be understood that the drawing and description in this disclosure are proffered to facilitate comprehension of the invention, and should not be construed to limit the scope thereof.

What is claimed is:

1. A positron microscope system for producing magnified images of a specimen target, the positron microscope system comprising:
   slow positron source means for producing a source beam formed of low energy positrons;
   focusing means for focusing said source beam and directing said low energy positrons of said source beam onto the specimen target to produce secondary electrons emitted at the specimen target;
   time-of-flight adjustment means for controlling a duration of the period of travel of the secondary electrons; and
   gate means having closed and open states for controlling passage therethrough of the secondary electrons.

2. The positron microscope system of claim 1 wherein there is further provided detector means for detecting incident ones of the secondary electrons, said detector means being arranged on the other side of said gate means from said time-of-flight adjustment means.

3. The positron microscope system of claim 1 wherein there is further provided gamma ray detector means for detecting gamma rays produced by annihilations of positrons and electrons, said gamma detector means being arranged in the vicinity of the target specimen.

4. The positron microscope system of claim 3 wherein said gate means is responsive to said gamma ray detector means.

5. The positron microscope system of claim 1 wherein said time-of-flight adjustment means comprises means for adjusting a length of a path of travel of the secondary electrons.

6. The positron microscope system of claim 1 wherein said time-of-flight adjustment means comprises means for adjusting an electric field along a path of travel of the secondary electrons.

7. The positron microscope system of claim 1 wherein there is further provided pulse generator means for controlling the open and closed states of said gate means.

8. A positron microscope system for producing magnified images of a specimen target, the positron microscope system comprising:
   means for directing positrons to the specimen target for producing secondary electrons to be emitted from the speciment target in response to incident ones of the positrons;
   gamma ray detector means for producing an electrical detector signal in response to gamma rays produced as a result of interaction between positrons and electrons; and
   gate means having closed and open states for controlling passage therethrough of the secondary electrons.

9. The positron microscope system of claim 8 wherein said gate means is responsive to said gamma ray detector means.

10. The positron microscope system of claim 8 wherein there is further provided time-of-flight control means for controlling the duration of a time-of-flight of the secondary electrons.

11. A method of microscopy, the method comprising the steps
    producing a slow positron beam;
    propagating said slow positron beam to a specimen target to produce secondary electrons at the target;
    gamma-ray monitoring at least one gamma-ray produced in response to communication between said slow positron beam and said specimen target; and
    controlling the open and closed states of a gate in the path of said secondary electrons in response to said step of gamma ray monitoring.

12. The method of claim 11 wherein there is further provided the step of controlling a time-of-flight of said secondary electrons between said specimen target and said gate.

13. The method of claim 12 wherein there is further provided the step of producing images of selected types of positron events in response to said time-of-flight of said secondary electrons.

* * * * *